(12) United States Patent
Ichikawa et al.

(10) Patent No.: US 11,410,975 B2
(45) Date of Patent: Aug. 9, 2022

(54) DISPLAY DEVICE AND METHOD OF MANUFACTURING DISPLAY DEVICE

(71) Applicant: Nichia Corporation, Anan (JP)

(72) Inventors: Kinya Ichikawa, Anan (JP); Katsuyoshi Kadan, Katsuura-gun (JP); Masahiko Sano, Anan (JP); Ryohei Hirose, Itano-gun (JP); Hiroshi Yoneda, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/796,083

(22) Filed: Feb. 20, 2020

(65) Prior Publication Data
US 2020/0266176 A1    Aug. 20, 2020

(30) Foreign Application Priority Data

Feb. 20, 2019 (JP) .............................. JP2019-028728
Oct. 8, 2019 (JP) .............................. JP2019-184963

(51) Int. Cl.
*H01L 25/075* (2006.01)
*H01L 21/66* (2006.01)
(Continued)

(52) U.S. Cl.
CPC .......... *H01L 25/0753* (2013.01); *H01L 22/22* (2013.01); *H01L 33/22* (2013.01);
(Continued)

(58) Field of Classification Search
CPC ..... H01L 25/0753; H01L 22/22; H01L 33/22; H01L 33/46; H01L 33/62; H01L 2933/0066
See application file for complete search history.

(56) References Cited

U.S. PATENT DOCUMENTS 8,791,474 B1    7/2014   Bibl et al.
2013/0181249 A1  7/2013   Aoyagi et al.
(Continued)

FOREIGN PATENT DOCUMENTS

JP    2006-140247    6/2006
JP    2013-157496    8/2013
(Continued)

OTHER PUBLICATIONS

Restriction requirement issued by the U.S. Patent and Trademark Office for the co-pending U.S. Appl. No. 16/796,221, dated Jun. 15, 2021.
(Continued)

*Primary Examiner* — Feifei Yeung Lopez
(74) *Attorney, Agent, or Firm* — Mori & Ward, LLP

(57) ABSTRACT

A method of manufacturing a display device 1 includes: providing a substrate including at least one sub-pixel defined therein and a first wiring disposed for the sub-pixel, and the light-emitting element that includes a first electrode disposed on a lower surface and a second electrode disposed on at least two lateral surfaces intersecting with each other; mounting the light-emitting element on the substrate and electrically connecting the first electrode to the first wiring; forming a resin member covering the at least one light-emitting element, on the substrate, exposing a portion of the second electrode from an upper surface of the resin member by removing an upper portion of the resin member; and forming a second wiring with a mesh shape on the resin member such that a portion of the second wiring is disposed on the light-emitting element to electrically connect the second wiring to the second electrode.

24 Claims, 9 Drawing Sheets

(51) Int. Cl.
 *H01L 33/46* (2010.01)
 *H01L 33/62* (2010.01)
 *H01L 33/22* (2010.01)

(52) U.S. Cl.
 CPC .............. *H01L 33/46* (2013.01); *H01L 33/62* (2013.01); *H01L 2933/0066* (2013.01)

(56) References Cited

U.S. PATENT DOCUMENTS

| | | | |
|---|---|---|---|
| 2014/0124731 A1* | 5/2014 | Jeong | H01L 33/32 257/13 |
| 2014/0267683 A1 | 9/2014 | Bibl et al. | |
| 2014/0367705 A1 | 12/2014 | Bibl et al. | |
| 2016/0027973 A1* | 1/2016 | Maki | H01L 33/387 257/99 |
| 2017/0069611 A1* | 3/2017 | Zhang | H01L 25/167 |
| 2017/0069681 A1* | 3/2017 | Lee | H01L 27/153 |
| 2017/0125392 A1* | 5/2017 | Bibl | H01L 25/0753 |
| 2019/0156093 A1* | 5/2019 | Kim | G06F 3/044 |
| 2020/0052160 A1* | 2/2020 | Li | H01L 25/0753 |
| 2020/0098963 A1 | 3/2020 | Maeda et al. | |
| 2020/0168777 A1* | 5/2020 | Kang | H01L 33/52 |
| 2021/0147631 A1* | 5/2021 | Reit | H01L 29/785 |

FOREIGN PATENT DOCUMENTS

| | | |
|---|---|---|
| JP | 2013-258371 | 12/2013 |
| JP | 2018-10309 | 1/2018 |
| WO | WO 2018/082101 | 5/2018 |

OTHER PUBLICATIONS

Office Action with Form PTO-892 Notice of References Cited issued by the United States Patent and Trademark Office for the co-pending U.S. Appl. No. 16/796,221, dated Oct. 5, 2021.

Office Action issued by the United States Patent and Trademark Office for the co-pending U.S. Appl. No. 16/796,221, dated Dec. 9, 2021.

Notice of Allowance issued by the United States Patent and Trademark Office for the co-pending U.S. Appl. No. 16/796,221, dated Mar. 9, 2022.

* cited by examiner

DISPLAY DEVICE AND METHOD OF MANUFACTURING DISPLAY DEVICE

CROSS-REFERENCE TO RELATED APPLICATION

This application claims priority to Japanese Patent Application No. 2019-028728 filed on Feb. 20, 2019, and Japanese Patent Application No. 2019-184963 filed on Oct. 8, 2019, the disclosures of which are hereby incorporated by reference in their entireties.

BACKGROUND

The present disclosure relates to a display device and a method of manufacturing a display device.

A display device that uses micro light-emitting diodes (i.e., micro-LEDs) for pixels has been proposed as described in Japanese Patent Publication No. 2006-140247. This type of display devices in which the pixels are configured as self-luminescent elements provides higher resolution, higher contrast, and higher color reproducibility than display devices with a liquid-crystal panel. Also, typical micro-LEDs are formed of inorganic semiconductor materials, thereby having a longer lifetime than organic electro-luminescence elements, and being less likely to cause burn-in.

In a display device using micro-LEDs, light is extracted from an upper surface of the light-emitting element. In addition, the upper surface, as well as a lower surface of the light-emitting element, is needed to be connected to wirings. Thus, the upper surface of the light-emitting element needs to have both a high electrical-conductivity and a high light transmissivity. As a result, in a production line of the display device with micro-LEDs, mounting of the light-emitting element to a substrate becomes difficult, which increases the manufacturing cost.

SUMMARY

Certain embodiments are made in view of the above-mentioned current situation, and have objects to provide a display device that includes micro-LEDs as pixels and can be manufactured at low cost and a method of manufacturing a display device.

A method of manufacturing a display device according to certain embodiments of the present invention includes: providing a substrate and a light-emitting element, wherein the substrate includes at least one sub-pixel and a first wiring disposed for the at least one sub-pixel, and the light-emitting element includes at least two lateral surfaces intersecting with each other and a lower surface, wherein a first electrode disposed on the lower surface, and a second electrode disposed on the at least two lateral surfaces; mounting the at least one light-emitting element on the substrate and electrically connecting the first electrode to the first wiring; forming a resin member on the substrate, the resin member covering the at least one light-emitting element; exposing a portion of the second electrode from an upper surface of the resin member by removing an upper portion of the resin member; and forming a second wiring with a mesh shape on the resin member such that a portion of the second wiring is disposed on the at least one light-emitting element to electrically connect the second wiring to the second electrode.

A display device according to certain embodiments of the present invention includes a substrate includes at least one sub-pixel, a first wiring disposed for the at least one sub-pixel on the substrate, at least one light-emitting element mounted for the at least one sub-pixel on the substrate, a resin member covering a lower portion of the at least one light-emitting element and the first wiring, and a second wiring with a mesh shape disposed on the resin member such that a portion of the second wiring is disposed on the at least one light-emitting element. The at least one light-emitting element includes a semiconductor having a lower surface and at least two lateral surfaces that intersect with each other, a first electrode disposed on the lower surface and electrically connected to the first wiring, and a second electrode disposed on the at least two lateral surfaces, a portion of the second electrode being exposed from an upper surface of the resin member. The second wiring is electrically connected to the portion of the second electrode that is exposed from the resin member.

Certain embodiments of the present disclosure allow for providing a display device that includes micro-LEDs as pixels and can be manufactured at low cost, and a method of manufacturing a display device.

EMBODIMENTS

First Embodiment

Figure 1:
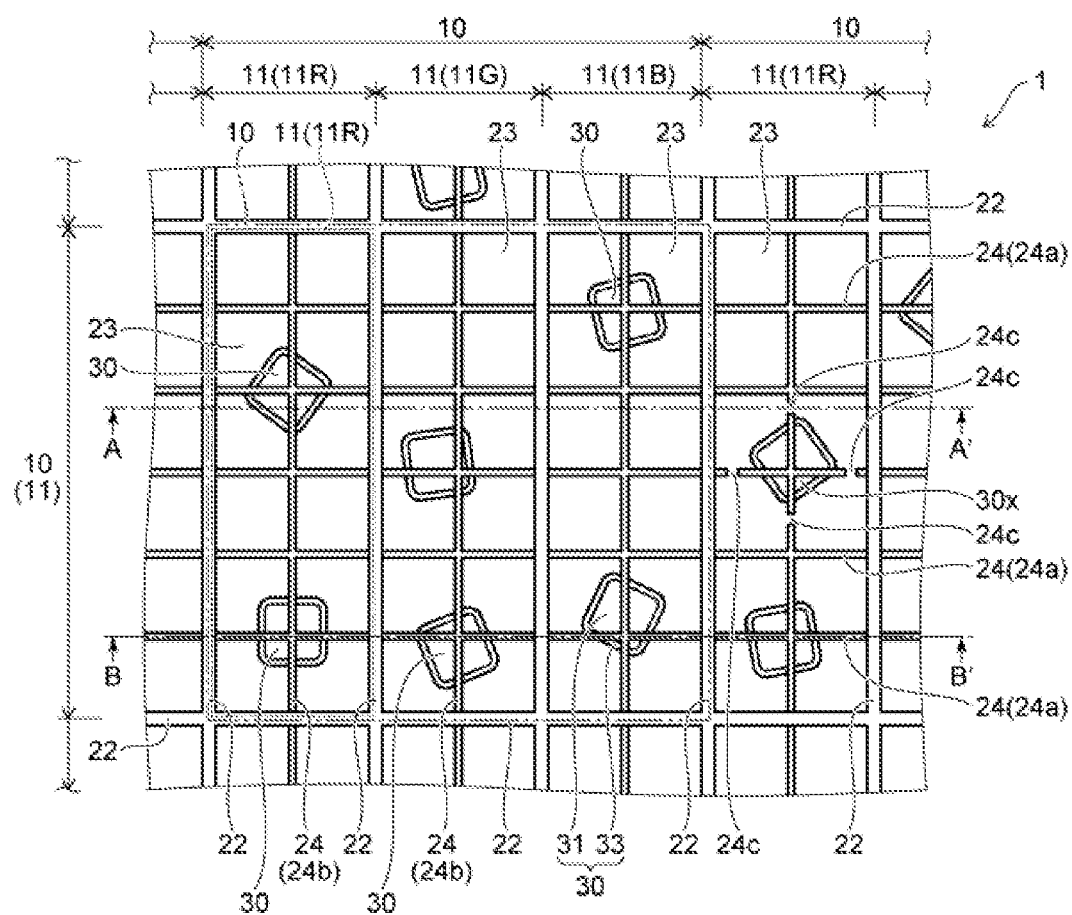
FIG. 1 is a schematic top view illustrating a display device according to a first embodiment.

First, a first embodiment will be described.

A display device 1 according to the present embodiment includes a substrate 20, a plurality of first wirings 21 disposed for each of sub-pixels 11 on the substrate 20, at least one light-emitting element 30 mounted for each of the sub-pixels 11 on the substrate 20, a resin member 23 covering a lower portion of the light-emitting element 30 and the first wirings 21, and a second wiring 24 with a mesh shape disposed on the resin member 23 such that a portion of the second wiring 24 is disposed on the light-emitting element 30. The light-emitting element 30 includes a semiconductor member 31, a first electrode 35 formed on a lower surface 31a of the semiconductor member 31 and electrically connected to the first wiring 21, and a second electrode 33 disposed on at least two lateral surfaces 31b of the semiconductor member 31 in a top view, the two lateral surfaces 31b intersecting with each other, and partly exposed from an upper surface 23a of the resin member 23. The second wiring 24 is electrically connected to a portion of the second electrode 33 that is exposed from the resin member 23.

Configurations of the display device 1 will be described below in detail.

Figure 2A:
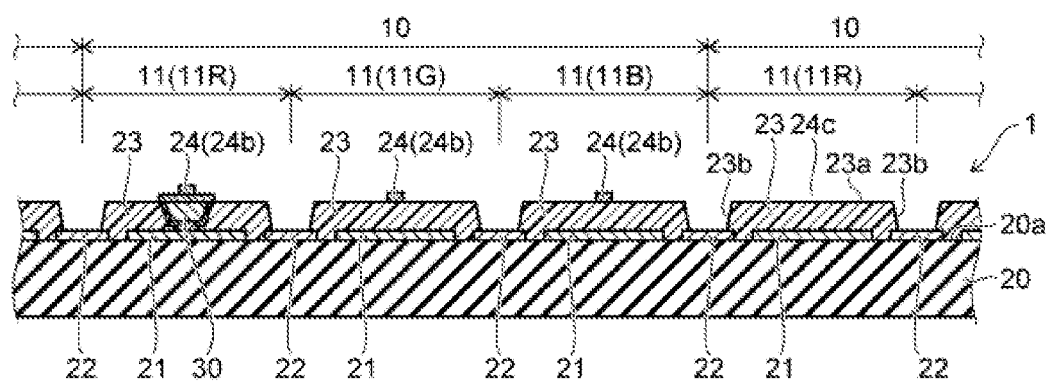
FIG. 2A is a schematic end view taken along the line A-A' in FIG. 1.
Figure 2B:
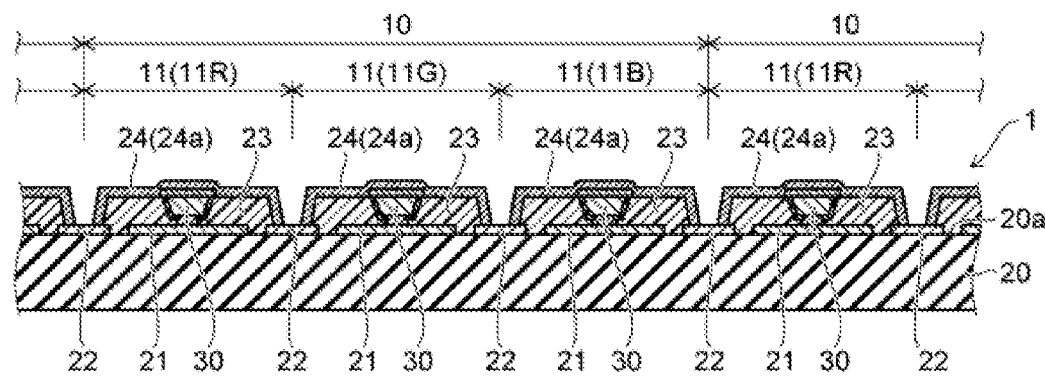
FIG. 2B is a schematic end view taken along the line B-B' in FIG. 1.

As shown in FIGS. 1, 2A, and 2B, the substrate 20 is provided in the display device 1 according to the present embodiment. The substrate 20 includes wirings disposed in an insulating base material. Also, an active-matrix transistor is formed on the substrate 20. The active-matrix transistor is a switching element that determines whether to supply power to the light-emitting elements 30 or not in each sub-pixel 11.

A plurality of pixels 10 are defined in the substrate 20. The pixels 10 are arranged along a first direction and a second direction orthogonal to the first direction to form a matrix shape. One or more, for example, three sub-pixels 11 are defined in each pixel 10. For example, three sub-pixels 11 in each pixel 10 include a sub-pixel 11R that emits red light, a sub-pixel 11G that emits green light, and a sub-pixel 11B that emits blue light. The number of sub-pixels 11 included in each pixel 10 is not limited to three. In FIG. 1, an outer edge of single pixel 10 is indicated by a double-dot chain line. An outer edge of single sub-pixel 11R is indicated by a dashed line.

The first wirings 21 are disposed on the substrate 20. The first wirings 21 each have an isolated island-shape in each sub-pixel 11 in a top view, and is electrically connected to the wirings of the substrate 20. Surfaces of the first wirings 21 preferably have a high light reflectance. This can allow a portion of light emitted from the light-emitting element 30 to be reflected upward, and increase brightness of the sub-pixels 11. An electrode 22 is disposed between the sub-pixels 11 on the substrate 20. The electrode 22 has, for example, a shape of grid-like pattern in a top view. The first wiring 21 and the electrode 22 include metals. For example, the first wiring 21 and the electrode 22 are formed of a metal material as a main material having the same electro-conductivity, for example, silver (Ag) or copper (Cu). For example, the first wiring 21 has substantially the same thickness as the thickness of the electrode 22. Light reflectance on a surface of the electrode 22 is preferably lower than light reflectance on a surface of the first wiring 21. This may reduce brightness in a region between the sub-pixels 11, and increase a contrast of a screen. In order to reduce the light reflectance on the surface of the electrode 22, roughening and/or black film forming can be performed thereon, for example.

The one or more light-emitting elements 30 are disposed on the first wiring(s) 21. The light-emitting elements 30 are mounted on the substrate 20 via the first wiring(s) 21. The light-emitting elements 30 are micro-LEDs. The micro-LED has, for example, a quadrangular shape with a side length of approximately 5 µm to 100 µm, preferably of 10 µm to 50 µm, in a top view. Each sub-pixel 11 includes one or more, preferably two or more light-emitting elements 30. For example, each sub-pixel 11 includes two light-emitting elements 30. As an example, the sub-pixel 11R includes the light-emitting elements 30 that emit red light, the sub-pixel 11G includes the light-emitting elements 30 that emit green light, and the sub-pixel 11B includes the light-emitting elements 30 that emit blue light. One or more of the light-emitting elements 30 can be disposed in each sub-pixel 11, and are not necessarily arranged along a single direction.

The resin member 23 is disposed for each sub-pixel 11 on the substrate 20. The resin member 23 is formed of an insulating resin material as a main material. The resin member 23 has, for example, a substantially rectangular parallelepiped shape or a truncated quadrangular pyramid. The resin member 23 separately covers entirety of the first wirings 21. The light-emitting element 30 has the lower portion covered with the resin member 23 and an upper portion exposed from the upper surface 23a of the resin member 23. The electrode 22 has end portions in the width direction, both of which are covered with the resin member 23. The electrode 22 has a central portion in the width direction, the central portion being exposed from the resin member 23.

The second wiring 24 with a mesh shape is disposed on the upper surface 23a and the lateral surface 23b of the resin member 23. The second wiring 24 has a plurality of first linear portions 24a extending in a first direction and a plurality of second linear portions 24b extending in a second direction. The second linear portions 24b are connected to the first linear portions 24a. A portion of the second wiring 24 is disposed above the light-emitting element 30, and passes across an upper surface of the light-emitting element 30. This configuration can allow a portion of the upper surface and a portion of the lateral surfaces of each light-emitting element 30 to be in contact with the second wiring 24. In the second wiring 24, both ends of each of the first linear portions 24a and both ends of each of the second linear portions 24b are connected to the electrode 22. This configuration can allow all second wirings 24 to be connected with each other via the electrode 22.

Configurations of the light-emitting element 30 will be described below in detail.

Figure 3A:
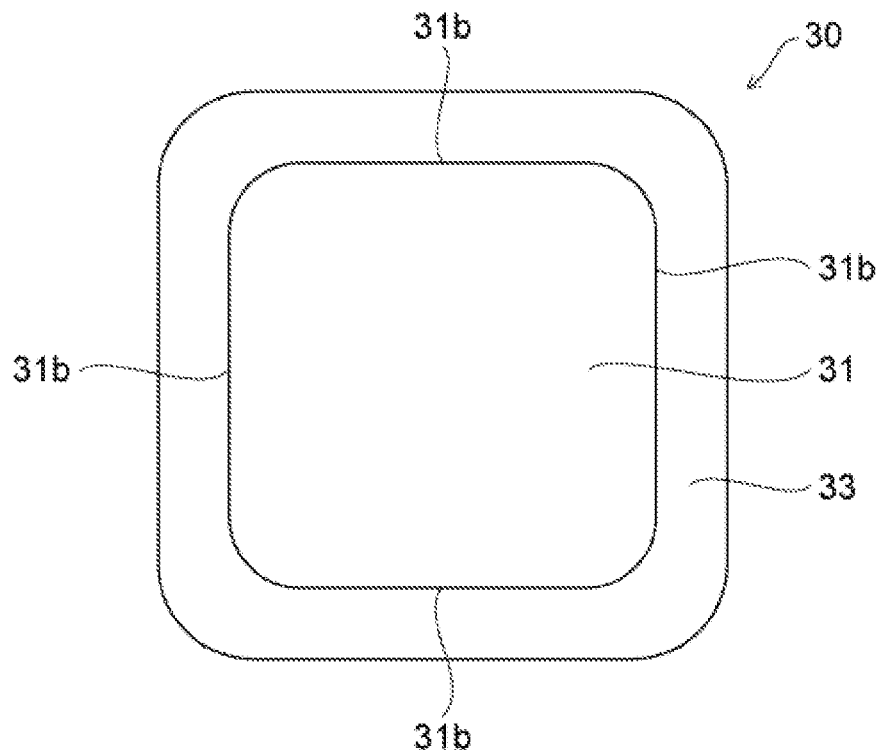
FIG. 3A is a schematic top view illustrating a light-emitting element of the display device according to the first embodiment.
Figure 3B:
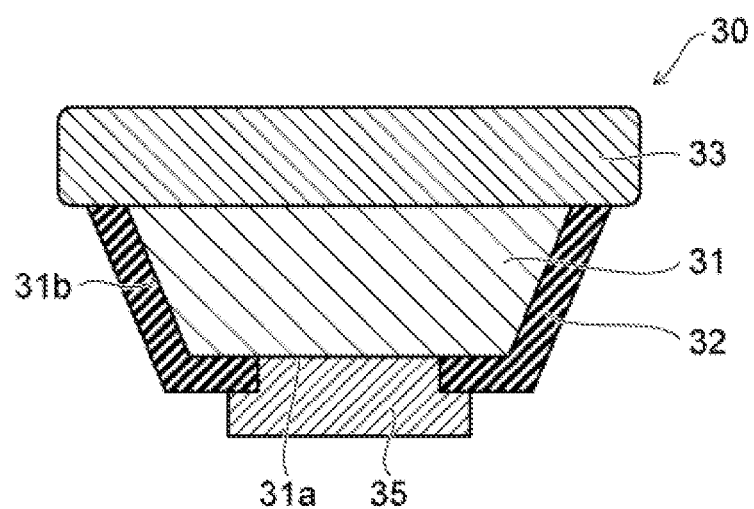
FIG. 3B is a schematic end view illustrating the light-emitting element of the display device according to the first embodiment.
Figure 4A:
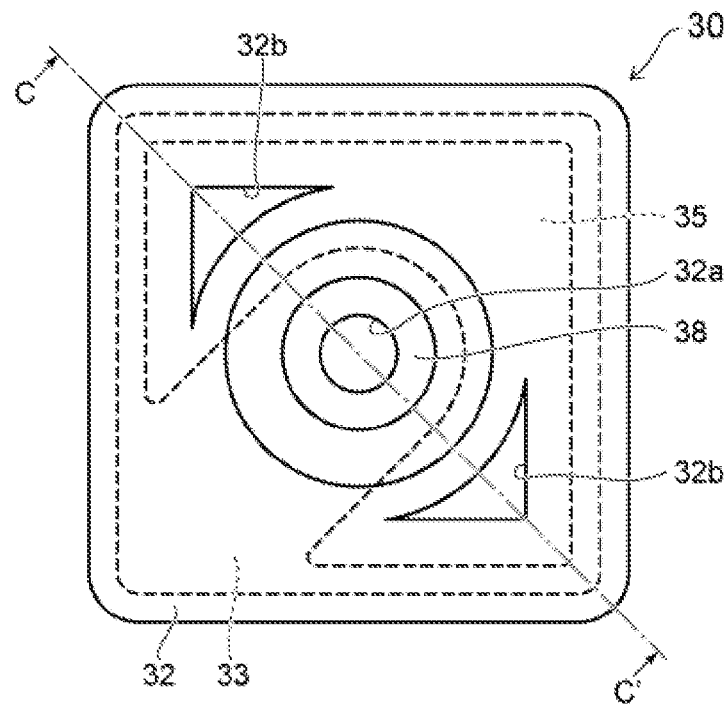
FIG. 4A is a schematic plan view illustrating the light-emitting element of the display device according to the first embodiment.
Figure 4B:
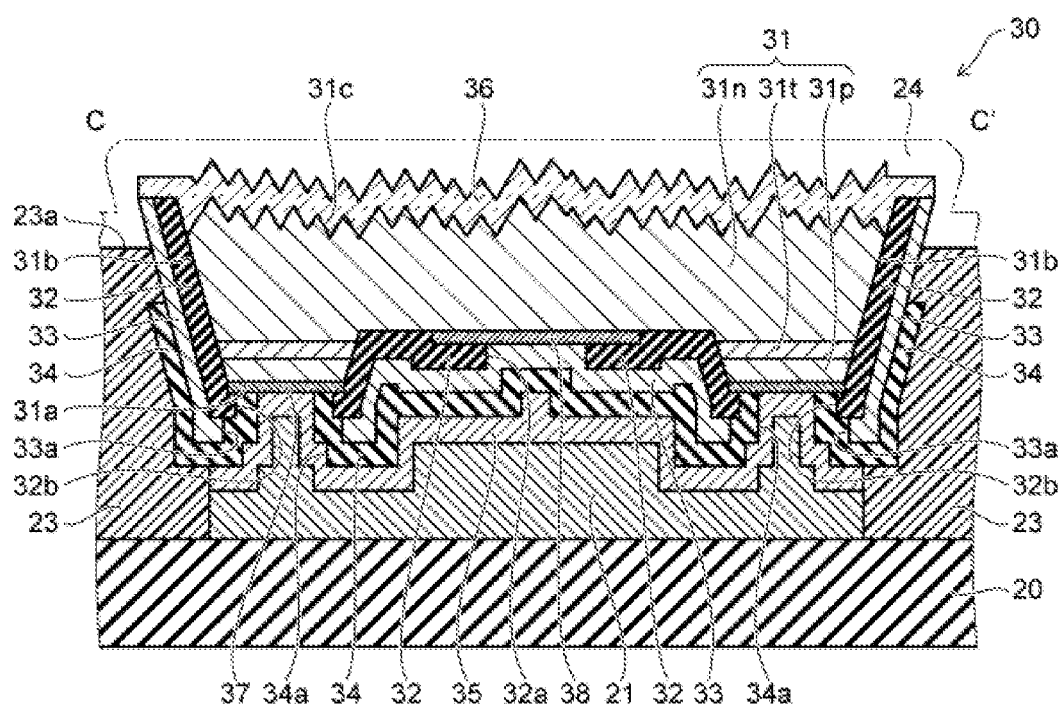
FIG. 4B is a schematic end view taken along the line C-C' in FIG. 4A.
Figure 5A:
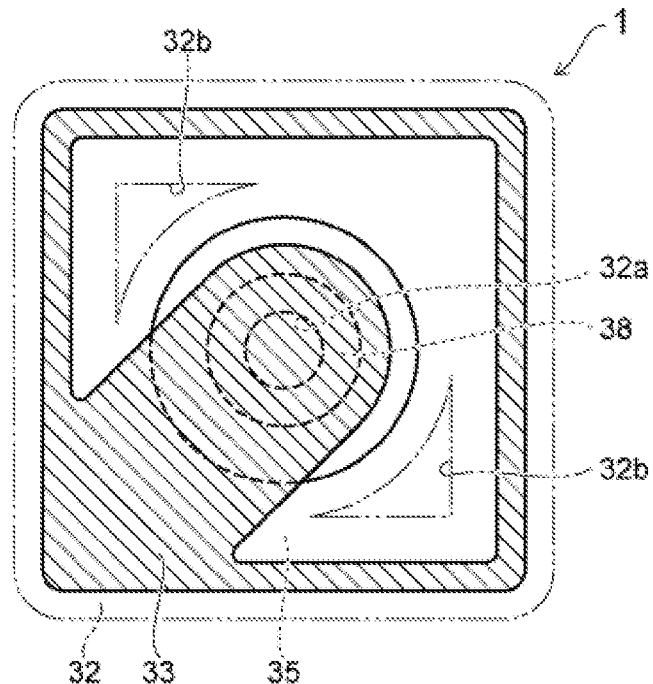
FIG. 5A is a schematic plan view illustrating a second electrode of the light-emitting element of the display device according to the first embodiment.
Figure 5B:
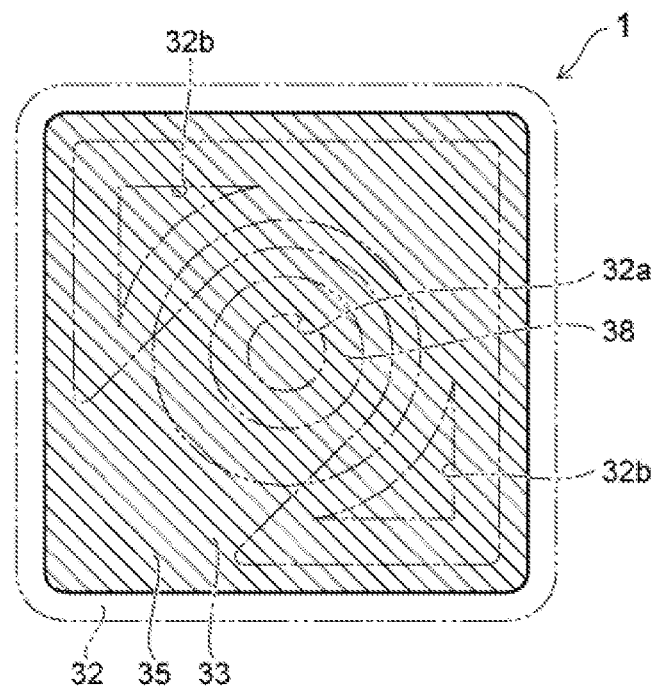
FIG. 5B is a schematic plan view illustrating a first electrode of the light-emitting element of the display device according to the first embodiment.
Figure 10:
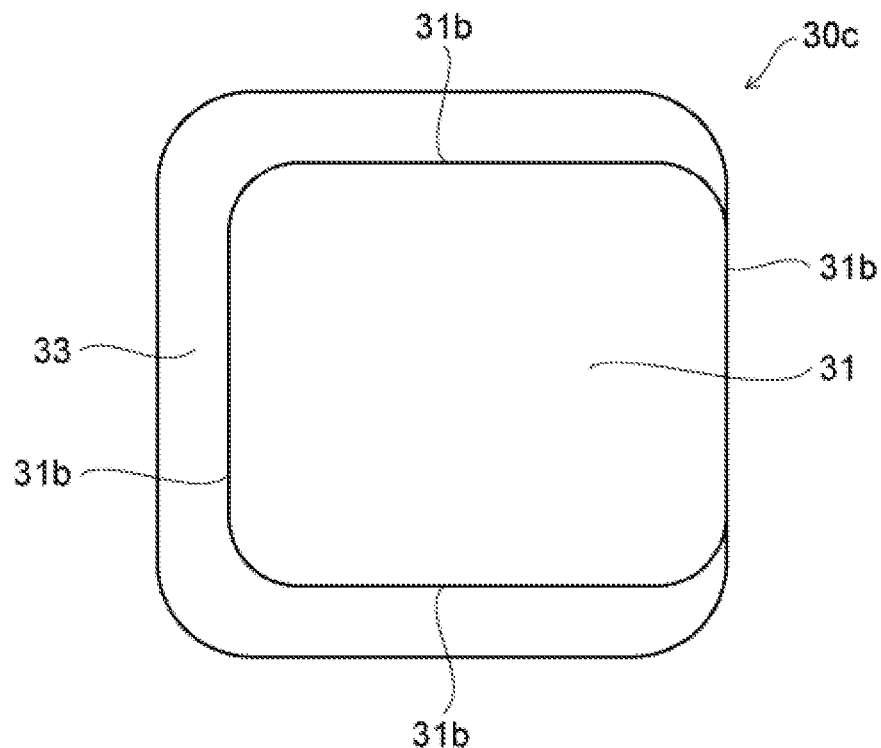
FIG. 10 is a schematic top view illustrating a light-emitting element of a display device according to a fourth embodiment.
Figure 11:
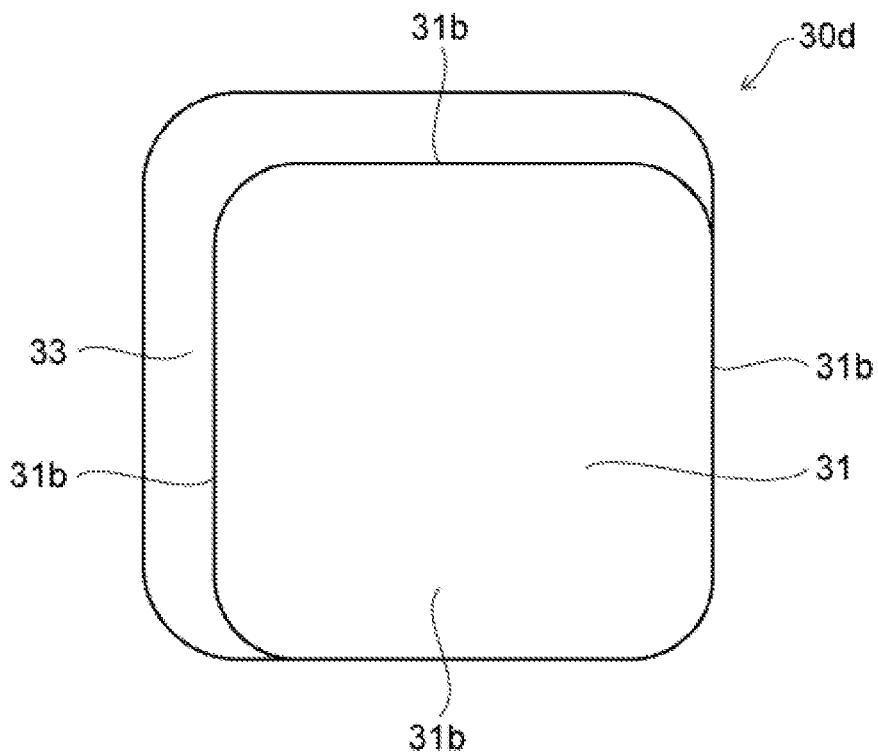
FIG. 11 is a schematic top view illustrating a light-emitting element of a display device according to a fifth embodiment.

As shown in FIGS. 3A, 3B, 4A, 4B, 5A, and 5B, the light-emitting element 30 includes the semiconductor member 31, a light reflective layer 32, the second electrode 33, an insulating layer 34, the first electrode 35, a protective layer 36, a first conductive layer 37, and a second conductive layer 38. The light-emitting element 30 has, for example, a quadrangular shape in a top view. FIGS. 3A and 3B are schematic diagrams illustrating only the semiconductor member 31, the first electrode 35, the second electrode 33, and the light reflective layer 32 simplistically, and other components are omitted. FIGS. 10 and 11 shown below are drawn in the same manner as above. FIGS. 4A to 5B are diagrams illustrating the configuration of the light-emitting element 30 in detail. For easy understanding, in FIG. 5A, the second electrode 33 is shown with hatching. In FIG. 5B, the first electrode 35 is shown with hatching. In FIGS. 4A, 5A, and 5B, the semiconductor member 31 is omitted.

The semiconductor member 31 has, for example, a nearly reversed truncated quadrangular pyramid with the lower surface 31a, four lateral surfaces 31b, and an upper surface 31c, as shown in FIG. 4B. For example, the upper surface 31c is roughened. The semiconductor member 31 includes a first semiconductor layer 31p, a light-emitting layer 31t, and a second semiconductor layer 31n. The first conductive layer 37 is disposed on a lower surface of the first semiconductor layer 31p. The second conductive layer 38 is disposed, for example, at a central portion of a lower surface of the second semiconductor layer 31n.

The insulating light reflective layer 32 is disposed on the lower surface 31a and the lateral surface 31b of the semiconductor member 31. The light reflective layer 32 is, for example, a distributed Bragg reflector (DBR) layer that includes a multilayer structure of, for example, niobium oxide (NbO) and aluminum oxide (AlO) layered alternately with each other. Openings 32a and 32b are formed at portions of the light reflective layer 32, the portions being positioned under the semiconductor member 31. The opening 32a is, for example, formed at a region that includes a center of the lower surface 31a, and has, for example a circular shape as seen from a bottom. The second conductive layer 38 is disposed in the opening 32a in a plan view. The openings 32b are, for example, formed near two corners of the lower surface 31a that are diagonally opposite to each other, and each have, for example, a substantially isosceles right triangle with a curved hypotenuse in a recessed circular arc shape. The first semiconductor layer 31p and the light-emitting layer 31t of the semiconductor member 31 and the first conductive layer 37 are positioned only within the opening 32b as seen from a bottom, whereas the second semiconductor layer 31n of the semiconductor member 31 is positioned in a whole area surrounded by the light reflective layer 32 as seen from a bottom.

The second electrode 33 is disposed outside the light reflective layer 32. That is, the second electrode 33 is disposed on the lower surface 31a and the lateral surfaces 31b of the semiconductor member 31 via the light reflective layer 32. In other words, the light reflective layer 32 is disposed between the second electrode 33 and the lower surface 31a of the semiconductor member 31 as well as between the second electrode 33 and the lateral surfaces 31b. The second electrode 33 reaches to an upper end of the lateral surface 31b of the semiconductor member 31. A portion of the second electrode 33 is exposed from the upper surface 23a of the resin member 23. The second electrode 33 is formed of metal materials such as silver or aluminum, as a main material.

A portion of the second electrode 33 corresponding to the opening 32a protrudes upward to enter the opening 32a of the light reflective layer 32. The second electrode 33 is electrically connected to the second conductive layer 38 via the opening 32a of the light reflective layer 32. The second conductive layer 38 is electrically connected to the second semiconductor layer 31n of the semiconductor member 31 at the lower surface 31a of the semiconductor member 31. On the other hand, openings 33a are formed at portions of the second electrode 33 corresponding to the openings 32b of the light reflective layer 32. That is, the second electrode 33 is not disposed at regions directly below the openings 32b.

In the present embodiment, the second electrode 33 has a cup shape that substantially surrounds surfaces of the semiconductor member 31 excluding the upper surface 31c. The second electrode 33 is disposed around the semiconductor member 31 in a top view. That is, the second electrode 33 is disposed on all four lateral surfaces 31b of the semiconductor member 31. As will be described below, it suffices that the second electrode 33 is disposed only on at least two lateral surfaces 31b of the semiconductor member 31 which intersect with each other. Also, the second electrode 33 is disposed at a region corresponding to the opening 32a of the light reflective layer 32 at the lower surface 31a of the semiconductor member 31, and this region is continuous to a portion of the second electrode 33 disposed on the lateral surface 31b.

The insulating layer 34 is disposed to cover a lower portion of the second electrode 33. A portion of the insulating layer 34 corresponding to the opening 32a of the light reflective layer 32 protrudes upward so as to enter the opening 32a. On the other hand, openings 34a are formed at portions of the insulating layer 34 corresponding to the openings 32b of the light reflective layer 32. That is, the insulating layer 34 is not disposed at regions directly below the openings 32b. An upper end of the insulating layer 34 is located lower than an upper end of the second electrode 33. Hence, the insulating layer 34 does not cover an upper portion of the second electrode 33. With the insulating layer 34 not covering the upper portion of the second electrode 33, the second electrode 33 can be electrically connected to the second wiring 24, as will be described below.

The first electrode 35 is disposed under the insulating layer 34. The first electrode 35 is formed of metal materials as a main material that includes, for example, silver or copper. The first electrode 35 can be made of silver or copper. The first electrode 35 is disposed on substantially a whole area of the lower surface 31a of the semiconductor member 31 via the light reflective layer 32, the second electrode 33, and the insulating layer 34. The first electrode 35 has a portion corresponding to the opening 32a of the light reflective layer 32 protrudes upward so as to enter the opening 32a, and portions corresponding to the openings 32b of the light reflective layer 32 protrude upward so as to enter the openings 32b. The first electrode 35 is electrically connected to the first conductive layer 37 via the openings 34a of the insulating layer 34, the openings 33a of the second electrode 33, and the openings 32b of the light reflective layer 32. The first conductive layer 37 is electrically connected to the first semiconductor layer 31p of the semiconductor member 31 at the lower surface 31a of the semiconductor member 31. The protective layer 36 is disposed on the upper surface 31c of the semiconductor member 31.

The first electrode 35 is electrically connected to the first wiring 21 at a lower surface of the light-emitting element 30. In the light-emitting element 30, the first semiconductor layer 31p of the semiconductor member 31 is connected to the active-matrix transistor via the first conductive layer 37, the first electrode 35, the first wiring 21, and wirings in the substrate 20. The second semiconductor layer 31n is connected to the second electrode 33 via the second conductive layer 38. At an upper portion of the light-emitting element 30, a portion of the second electrode 33 which is exposed from the upper surface 23a of the resin member 23 is partly electrically connected to the second wiring 24. This can provide power supply between the first semiconductor layer 31p and the second semiconductor layer 31n of the semiconductor member 31. In FIG. 4B, the second wiring 24 is indicated by a double-dot chain line.

As shown in FIG. 1, a disconnection portion 24c can be formed at the second wiring 24 of the display device 1. This configuration allows a defective light-emitting element 30x to be disconnected from the second wiring 24. The types of defect of the defective light-emitting element 30x include, for example, short-circuit, disconnection, and unstable conduction.

Next, the method of manufacturing the display device according to the present embodiment will be described.

FIGS. 6A to 7C are schematic end views illustrating the method of manufacturing the display device according to the present embodiment.

Providing Substrate 20 and Light-Emitting Element 30

Figure 6A:
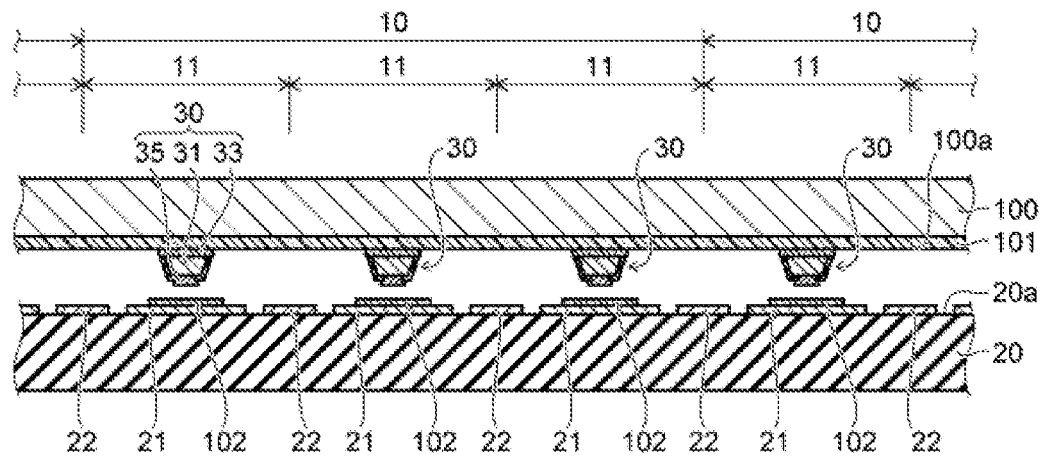
FIG. 6A is a schematic end view illustrating a method of manufacturing the display device according to the first embodiment.

First, the substrate 20 and the light-emitting element 30 are provided as shown in FIG. 6A. In the substrate 20, pixels 10 are arranged in a matrix shape. Each of the pixels 10 includes one or more sub-pixels 11. On the upper surface 20a of the substrate 20, the first wirings 21 are disposed for each sub-pixel 11. The electrode 22 is disposed between the sub-pixels 11. An electro-conductive paste layer 102 is disposed on each of the first wirings 21.

The light-emitting element 30 is, for example, bonded to a lower surface 100a of a supporting substrate 100 via an adhesive sheet 101. For example, two light-emitting elements 30 are bonded on a region of the supporting substrate 100 that corresponds to each sub-pixel 11. One or more, preferably two or more light-emitting elements 30 are included in each of the sub-pixel 11. The configuration of the light-emitting element 30 is described as above. That is, the first electrode 35 configures the lower surface of the light-emitting element 30, and the second electrode 33 configures at least two lateral surfaces that intersect with each other. The second electrode 33 can configure, for example, four lateral surfaces.

Mounting Light-Emitting Element 30 on Substrate 20 and Connecting First Electrode 35 to First Wiring 21

Figure 6B:
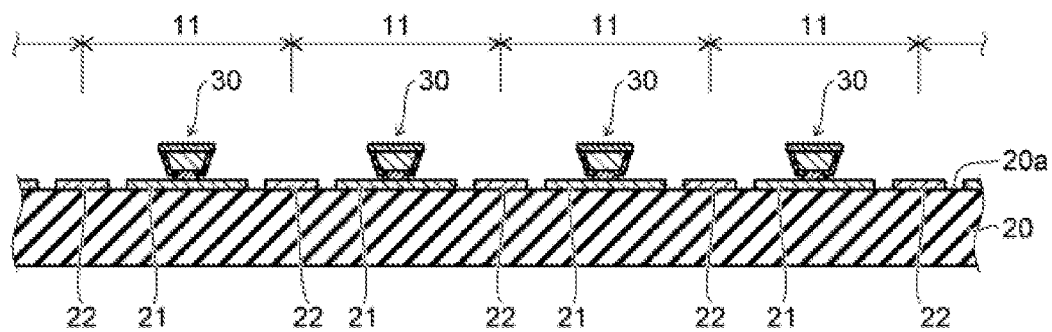
FIG. 6B is a schematic end view illustrating the method of manufacturing the display device according to the first embodiment.

Next, as shown in FIG. 6B, the light-emitting element 30 is brought into contact with the electro-conductive paste layer 102 so as to be bonded to the lower surface 100a of the supporting substrate 100 while the lower surface 100a faces the upper surface 20a of the substrate 20. Then, the electro-conductive paste layer 102 is sintered. This allows the first electrode 35 of the light-emitting element 30 to be electrically connected to the first wiring 21, and the light-emitting element 30 is mounted on the substrate 20. Hereinafter, the electro-conductive paste layer 102 is shown as a portion of the first wiring 21.

Subsequently, the adhesive sheet 101 is removed by, for example, dissolving. This allows the supporting substrate 100 to be detached from the light-emitting element 30. Hence, the light-emitting element 30 is transferred from the supporting substrate 100 to the substrate 20. At this time, for example, two light-emitting elements 30 are mounted on each sub-pixel 11. The light-emitting element 30 has, for example, a quadrangular shape in a top view.

Forming Resin Member 23

Figure 7A:
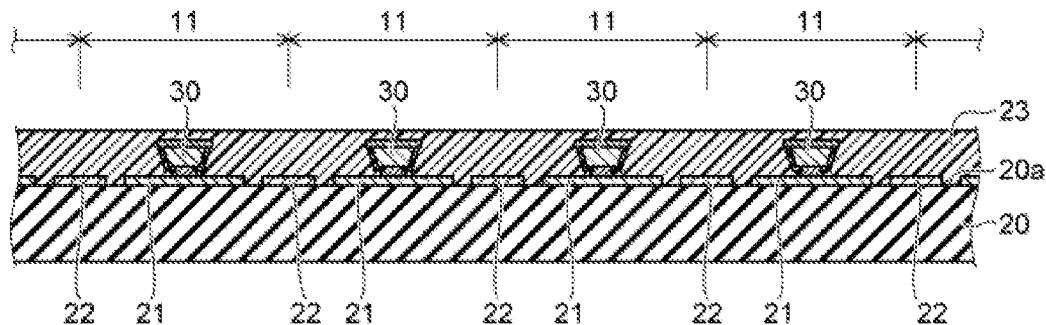
FIG. 7A is a schematic end view illustrating the method of manufacturing the display device according to the first embodiment.

Subsequently, as shown in FIG. 7A, the resin member 23 is formed on the substrate 20 to cover the light-emitting element 30. For example, a photosensitive resin is applied on the upper surface 20a of the substrate 20, then the photosensitive resin is developed and cured. Alternatively, a dry film formed of a photosensitive resin is attached to the upper surface 20a of the substrate 20. The resin member 23 is thus formed. At this time, the resin member 23 entirely covers the plurality of light-emitting elements 30 that are mounted on the plurality of sub-pixels 11.

Exposing Second Electrode 33 from Resin Member 23

Figure 7B:
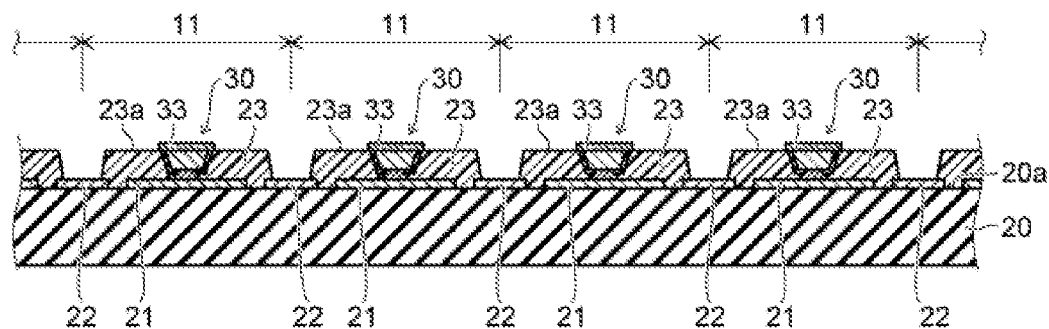
FIG. 7B is a schematic end view illustrating the method of manufacturing the display device according to the first embodiment.

Next, as shown in FIG. 7B, etching such as reactive ion etching (RIE) using oxygen ($O_2$) is performed to the upper surface 23a of the resin member 23, so as to remove an upper portion of the resin member 23. This allows the upper portion of the light-emitting element 30 including an upper portion of the second electrode 33 to be exposed from the upper surface 23a of the resin member 23. At this time, the resin member 23 is divided for each sub-pixel 11 to expose the electrode 22. Thus, the resin member 23 has, for example, a substantially rectangular parallelepiped shape or a truncated quadrangular pyramid.

Forming Second Wiring 24 on Resin Member 23

Figure 7C:
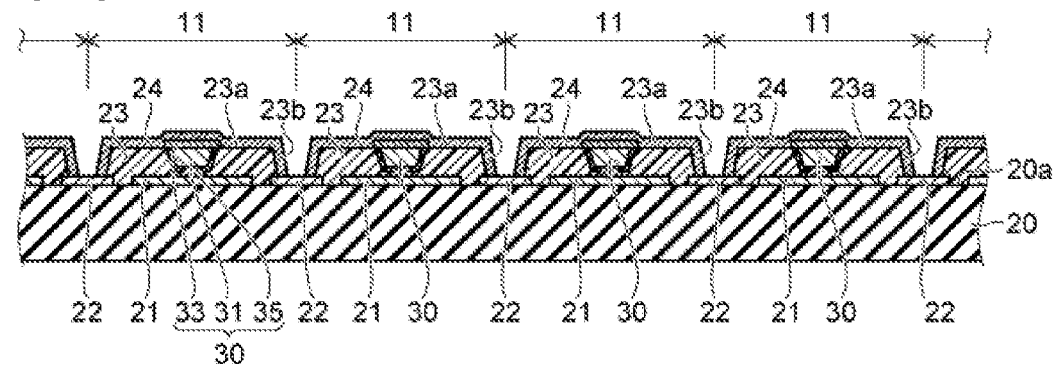
FIG. 7C is a schematic end view illustrating the method of manufacturing the display device according to the first embodiment.

Next, as shown in FIGS. 1 and 7C, the second wiring with a mesh shape 24 is formed on resin member 23. For example, the mesh shape is formed, for example, by applying an electro-conductive paste on the whole surface using spin coating, sintering the electro-conductive paste, and then forming a mesh shape by photolithography. Hence, the second wiring 24 is formed in which first linear portions 24a extending in a first direction and second linear portions 24b extending in a second direction are formed on the upper surface 23a and a lateral surface 23b of the resin member 23.

For example, the first direction and the second direction are two directions of alignment of pixels 10, but not limited to this. A region surrounded by two first linear portions 24a and two second linear portions 24b is not limited to a rectangle and can be a parallelogram. Also, the second wiring 24 can include a third linear portion extending in a third direction. For example, in a top view, the second wiring 24 can have a shape in which triangles are arranged or a honeycomb shape in which hexagons are arranged. In the present specification, the "mesh shape" includes these shapes.

In a top view, a gap between the first linear portions 24a and a gap between the second linear portions 24b being equal to or less than a length of a side of the light-emitting element 30 can ensure a portion of the second wiring 24 to be disposed on the light-emitting element 30. In a top view, the second electrode 33 are disposed at a periphery of the semiconductor member 31 while being in the light-emitting element 30. Thus, the second wiring 24 is in contact with and electrically connected to the second electrode 33 of each light-emitting element 30. Also, the second wiring 24 is in contact with and electrically connected to the electrode 22. Consequently, the second wiring 24 connects the second electrodes 33 of all the light-emitting elements 30 as a common wiring. The light-emitting element 30 is thus connected to the first wiring 21 and the second wiring 24.

Disconnecting Defective Light-Emitting Element 30x from Second Wiring 24

Subsequently, as shown in FIG. 1, each light-emitting element 30 is inspected to detect defects. If a defective light-emitting element 30x is detected, the light-emitting element 30x is separated from the second wiring 24 by cutting the first linear portions 24a and the second linear portions 24b of the second wiring 24 that are connected to the light-emitting element 30x by, for example, laser process. Thereafter, roughening for mat-finish or blackening for black film formation is performed on the surfaces of the electrode 22 and the second wiring 24 so as to reduce light reflectance on the electrode 22 and the second wiring 24.

This may improve a contrast of a screen. As above, the display device 1 according to the present embodiments is manufactured.

Next, effects of the present embodiment will be described.

In the display device 1 according to the present embodiment, in each light-emitting element 30, the second electrode 33 is disposed on the at least two lateral surfaces 31*b* of the semiconductor member 31, the two lateral surfaces intersecting with each other. The second wiring 24 has a mesh shape in a top view. This configuration may allow the second electrode 33 of each light-emitting element 30 to be in contact with the second wiring 24 at some portion even if a location and angle of the light-emitting element 30 somewhat deviate from a design value. Hence, the light-emitting element 30 can be electrically connected to the first wiring 21 and the second wiring 24 as far as the precision of alignment is ensured such that the first electrode 35 of the light-emitting element 30 is in contact with the first wiring 21, and excessive precision is not needed for mounting the light-emitting element 30 on the substrate 20. In this configuration, large margins of location and angle can be secured when the light-emitting element 30 is mounted on the substrate 20. As a result, the display device 1 can be easily manufactured at low cost.

In the present embodiment, with the second electrode 33 disposed on the lateral surface of the light-emitting element 30, the second electrode 33 does not necessarily cover an upper surface of the semiconductor member 31. Hence light emitted upward from the semiconductor member 31 may be effectively used. Also, the second wiring 24 has a mesh shape, so that a portion of light laterally emitted from the light-emitting element 30 can be reflected upwardly by the second wiring 24. This structure may also improve the light utilization efficiency.

Further, the second wiring 24 is formed of metals as a main material. Such second wiring 24 can have low resistance compared with a case in which wirings are formed of an electro-conductive transparent material such as indium-tin-oxide (ITO). Hence, the display device 1 has a high power-utilization efficiency.

Further, in the display device 1, each sub-pixel 11 includes two light-emitting elements 30. The two light-emitting element 30 are connected between the first wiring 21 and the second wiring 24 in parallel connection. If both of two light-emitting elements 30 disposed on certain sub-pixel 11 work properly, electric current flows through the two light-emitting elements 30 in parallel. On the contrary, if one of the two light-emitting elements 30 has a defect, the defective light-emitting element 30*x* is separated from the second wiring 24 by forming the disconnection portion(s) 24*c* in the second wiring 24. This can suppress a defect of the light-emitting element 30 from directly causing a defect of the sub-pixel 11 that exhibits, for example, a bright point or a dark point. In this case, as the defective light-emitting element 30*x* is disconnected from the electric circuit, a current flowing through the other light-emitting element 30 having no such defect becomes twice as high as usual, and therefore, the light-emitting element 30 emits light about twice as bright as usual. Hence, brightness of light emitted from the whole sub-pixel 11 is substantially the same regardless of with or without a defective light-emitting element 30*x* in the sub-pixel 11.

According to the present embodiment, the plurality of light-emitting elements 30 disposed in one sub-pixel 11 can serve as backups to each other, so that the sub-pixel 11 can operate properly even if one of the light-emitting elements 30 has a defect. This can improve yields and reduce the cost in manufacturing the display device 1. Each sub-pixel 11 can include three or more light-emitting elements 30.

Second Embodiment

Next, a second embodiment will be described.

Figure 8:
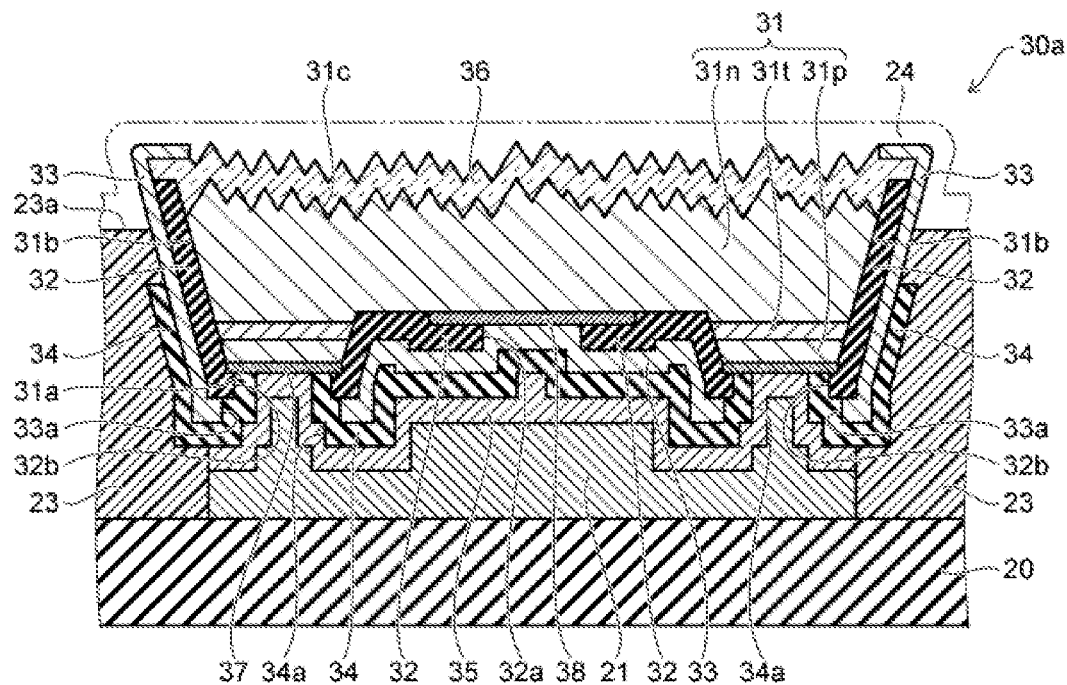
FIG. 8 is a schematic end view illustrating a light-emitting element of a display device according to a second embodiment.

FIG. 8 is a schematic end view illustrating a light-emitting element of a display device according to the present embodiment.

As shown in FIG. 8, the display device according to the present embodiment includes a light-emitting element 30*a*. In the light-emitting element 30*a*, the second electrode 33 reaches to a peripheral portion of an upper surface 31*c* of the semiconductor member 31. This configuration can ensure connection of the second wiring 24 to the second electrode 33. The structure, the manufacturing method, and the effect other than the above according to the present embodiment are the same as or similar to the structure, the manufacturing method, and the effect according to the first embodiment.

Third Embodiment

Next, a third embodiment will be described.

Figure 9:
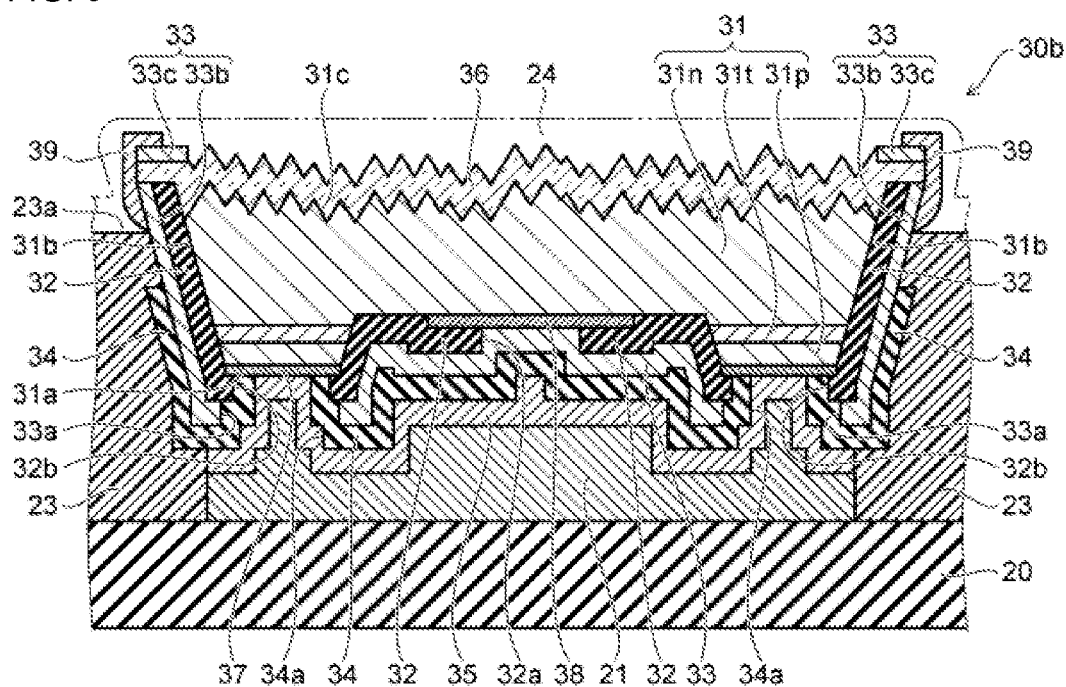
FIG. 9 is a schematic end view illustrating a light-emitting element of a display device according to a third embodiment.

FIG. 9 is a schematic end view illustrating a light-emitting element of a display device according to the present embodiment.

As shown in FIG. 9, the display device according to the present embodiment includes a light-emitting element 30*b*. In the light-emitting element 30*b*, the second electrode 33 is divided into a first portion 33*b* and a second portion 33*c*. The first portion 33*b* is disposed on a lower surface 31*a* and one or more lateral surfaces 31*b* of the semiconductor member 31. The second portion 33*c* is disposed on the peripheral portion of an upper surface 31*c* of the semiconductor member 31. The second portion 33*c* is separated from the first portion 33*b*. The light-emitting element 30*b* includes a metal plated layer 39. The metal plated layer 39 electrically connects the first portion 33*b* to the second portion 33*c* of the second electrode 33. The metal plated layer 39 is formed, for example, by electroplating.

According to the present embodiment, even if the second electrode 33 is divided into the first portion 33*b* and the second portion 33*c* depending on a condition of forming the second electrode 33, forming the metal plated layer 39 allows the second portion 33*c* to serve as a portion of the second electrode 33. The structure, the manufacturing method, and the effect according to the present embodiment other than the above are the same as or similar to the structure, the manufacturing method, and the effect according to the first embodiment.

Fourth Embodiment

Next, a fourth embodiment will be described.

FIG. 10 is a schematic top view illustrating a light-emitting element of a display device according to the present embodiment.

As shown in FIG. 10, the display device according to the present embodiment includes a light-emitting element 30*c*. In the light-emitting element 30*c*, the second electrode 33 is disposed on three lateral surfaces 31*b* of the semiconductor member 31. This structure may also provide the same or a similar effect as in the first embodiment.

Fifth Embodiment

Next, a fifth embodiment will be described.

FIG. 11 is a schematic top view illustrating a light-emitting element of a display device according to the present embodiment.

As shown in FIG. 11, the display device according to the present embodiment includes a light-emitting element 30d. In the light-emitting element 30d, the second electrode 33 is disposed on the two lateral surfaces 31b of the semiconductor member 31, the two lateral surfaces intersecting with each other. This structure may also provide the same or a similar effect as in the first embodiment.

The display device according to the present disclosure can be used for, for example, a device that visually displays information. Such a display includes a portable electronic device, a television receiver, and a display for many people.

The invention claimed is:

1. A method of manufacturing a display device, the method comprising:
    providing a substrate and at least one light-emitting element, wherein
       the substrate comprises sub-pixels, a first wiring disposed for at least one of the sub-pixels and an electrode disposed between the sub-pixels, the first wiring being flat, and
       the at least one light-emitting element comprises at least two lateral surfaces intersecting with each other and a lower surface, wherein
       a first electrode disposed on the lower surface, and
       a second electrode disposed on the at least two lateral surfaces;
    mounting the at least one light-emitting element on the substrate and electrically connecting the first electrode to the first wiring;
    forming a resin member on the substrate, the resin member covering the at least one light-emitting element and the electrode;
    exposing a portion of the second electrode from an upper surface of the resin member by removing an upper portion of the resin member, and exposing at least a portion of the electrode from a lateral surface of the resin member by removing a portion of the resin member, the electrode being disposed under the lower surface of the at least one light-emitting element, and the electrode being disposed on a same plane as the first wiring; and
    forming a second wiring with a mesh shape on the resin member such that a portion of the second wiring is disposed on the at least one light-emitting element to electrically connect the second wiring to the second electrode and the electrode, wherein the second wiring is disposed on the upper surface of the resin member and on the lateral surface of the resin member, and the second wiring is connected to the electrode disposed on both sides of the resin member.

2. The method of manufacturing a display device according to claim 1,
    wherein the at least one light-emitting element includes a semiconductor member, and
    wherein the second electrode is disposed around the semiconductor member in a top view.

3. The method of manufacturing a display device according to claim 1,
    wherein the at least one light-emitting element includes a semiconductor member having an upper surface, and
    wherein the second electrode is disposed also on a portion of the upper surface of the semiconductor member.

4. The method of manufacturing a display device according to claim 1, wherein the at least one light-emitting element has a rectangular shape in a top view.

5. The method of manufacturing a display device according to claim 1, wherein the second wiring comprises a first linear portion extending in a first direction and a second linear portion extending in a second direction that intersects the first direction and being connected to the first linear portion.

6. The method of manufacturing a display device according to claim 2, wherein the second wiring comprises a first linear portion extending in a first direction and a second linear portion extending in a second direction that intersects the first direction and being connected to the first linear portion.

7. The method of manufacturing a display device according to claim 3, wherein the second wiring comprises a first linear portion extending in a first direction and a second linear portion extending in a second direction that intersects the first direction and being connected to the first linear portion.

8. The method of manufacturing a display device according to claim 1,
    wherein the at least one light-emitting element comprises a plurality of light-emitting elements, and
    wherein plurality of the light-emitting elements are mounted on the at least one sub-pixel.

9. The method of manufacturing a display device according to claim 2,
    wherein the at least one light-emitting element comprises a plurality of light-emitting elements, and
    wherein the plurality of light-emitting elements are mounted on the at least one sub-pixel.

10. The method of manufacturing a display device according to claim 3,
    wherein the at least one light-emitting element comprises a plurality of light-emitting elements, and
    wherein the plurality of light-emitting elements are mounted on the at least one sub-pixel.

11. The method of manufacturing a display device according to claim 6, wherein the at least one light-emitting element comprises a defective light-emitting element, and the method further comprising
    disconnecting the defective light-emitting element from the second wiring.

12. The method of manufacturing a display device according to claim 1,
    wherein the at least one sub-pixel comprises a plurality of sub-pixels,
    wherein the at least one light-emitting element comprises a plurality of light-emitting elements,
    wherein in the step of forming the resin member, the resin member covers the plurality of light-emitting elements mounted on the plurality of sub-pixels, and
    wherein in the exposing step, the resin member is divided into each of the sub-pixels.

13. A display device comprising:
    a substrate comprising sub-pixels;
    a first wiring disposed for each of the sub-pixels on the substrate, the first wiring being flat;
    an electrode disposed between the sub-pixels on the substrate;

at least one light-emitting element mounted for each of the sub-pixels on the substrate;

a resin member covering a lower portion of the at least one light-emitting element and the first wiring the resin member having an upper surface and a lateral surface; and a second wiring with a mesh shape disposed on the resin member such that a portion of the second wiring is disposed on the at least one light-emitting element, the second wiring being disposed on the upper surface of the resin member and on the lateral surface of the resin member, wherein the at least one light-emitting element comprises
- a semiconductor member having a lower surface and at least two lateral surfaces that intersect with each other,
- a first electrode disposed on the lower surface and electrically connected to the first wiring, and
- a second electrode disposed on the at least two lateral surfaces, a portion of the second electrode being exposed from an upper surface of the resin member, wherein the second wiring is electrically connected to the portion of the second electrode that is exposed from the resin member and to the electrode disposed on both sides of the resin member, wherein the electrode is disposed under the lower surface of the semiconductor member of the at least one light-emitting element, and wherein the electrode being disposed on a same plane as the first wiring.

14. The display device according to claim 13, wherein the at least one light-emitting element further includes an insulating light reflective layer disposed between the lateral surfaces of the semiconductor member and the second electrode, wherein the second electrode is disposed at a periphery of the semiconductor member in a top view, and wherein the second electrode is electrically connected to the lower surface of the semiconductor member.

15. The display device according to claim 13,
wherein the at least one light-emitting element comprises a plurality of light-emitting elements, and
wherein the plurality of light-emitting elements are mounted on the at least one sub-pixel.

16. The display device according to claim 14,
wherein the at least one light-emitting element comprises a plurality of light-emitting elements, and
wherein the plurality of light-emitting elements are mounted on the at least one sub-pixel.

17. The display device according to claim 15,
wherein the plurality of light-emitting elements comprises a defective light-emitting element, and
wherein the defective light-emitting element is disconnected from the second wiring.

18. The display device according to claim 16,
wherein the plurality of light-emitting elements comprises a defective light-emitting element, and
wherein the defective light-emitting element is disconnected from the second wiring.

19. The method of manufacturing a display device according to claim 1,
wherein the first wiring is disposed directly under the at least one light-emitting element.

20. The method of manufacturing a display device according to claim 1,
wherein the electrode is disposed between adjacent two of the first wirings.

21. The display device according to claim 13,
wherein the first wiring is disposed directly under the at least one light-emitting element.

22. The display device according to claim 13,
wherein the electrode is disposed between adjacent two of the first wirings.

23. The method of manufacturing a display device according to claim 1,
wherein the electrode has a lattice shape, and
wherein the second wiring has a lattice shape.

24. The display device according to claim 13,
wherein the electrode has a lattice shape, and
wherein the second wiring has a lattice shape.

* * * * *